(12) United States Patent
Zhang et al.

(10) Patent No.: US 8,587,948 B2
(45) Date of Patent: Nov. 19, 2013

(54) DISPLAY MODULE HAVING ADJUSTABLE VIEW ANGLE FUNCTION

(75) Inventors: Jun-Xiong Zhang, Shenzhen (CN); Jie Yang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 221 days.

(21) Appl. No.: 13/236,657

(22) Filed: Sep. 20, 2011

(65) Prior Publication Data

US 2012/0300411 A1    Nov. 29, 2012

(30) Foreign Application Priority Data

May 26, 2011  (CN) .......................... 2011 1 0137938

(51) Int. Cl.
*H05K 5/00*    (2006.01)
(52) U.S. Cl.
USPC ................... 361/732; 361/679.21; 455/575.3; 455/575.4
(58) Field of Classification Search
USPC ............... 361/679.21, 679.26, 679.29, 679.3, 361/679.55, 679.56, 732; 313/582; 349/58–60; 345/173; 455/575.1–575.4
See application file for complete search history.

(56) References Cited

U.S. PATENT DOCUMENTS

| | | | |
|---|---|---|---|
| 7,107,084 B2 * | 9/2006 | Duarte et al. | 455/575.3 |
| 7,522,945 B2 * | 4/2009 | Kilpi et al. | 455/575.1 |
| 2004/0157653 A1 * | 8/2004 | Kato | 455/575.4 |
| 2010/0134973 A1 * | 6/2010 | Lee | 361/679.56 |
| 2010/0321866 A1 * | 12/2010 | Chuang et al. | 361/679.01 |
| 2011/0275422 A1 * | 11/2011 | Kemppinen | 455/575.4 |

* cited by examiner

*Primary Examiner* — Bernard Rojas
(74) *Attorney, Agent, or Firm* — Altis & Wispro Law Group, Inc.

(57) ABSTRACT

A display module includes a bottom cover, a locking part, a pressing part, and a display panel. The bottom cover includes a bottom wall and two sidewalls, defines a first groove on the bottom wall and a second groove on one sidewall. The locking part is rotatably mounted on the bottom wall, and includes a first hook. The pressing part is slidably received in the first groove, and rotatably connected with the locking part. The display panel includes a sliding part and a display part rotatably connected with each other. The sliding part includes one peg slidably received in the second groove and a second hook engaging with the first hook. When the pressing part is slid in the first groove to rotate the locking part, the first hook disengages from the second hook, the display part is pulled out from the bottom cover and rotated to adjust viewing angle.

10 Claims, 7 Drawing Sheets

DISPLAY MODULE HAVING ADJUSTABLE VIEW ANGLE FUNCTION

BACKGROUND

1. Technical Field

The present disclosure relates to display modules, particularly to an adjustable display module.

2. Description of Related Art

Servers usually include display modules to show information such as the working state of CPUs, fans, or the hard disks of the servers. The display module is usually mounted on a top surface of the server. If the server is positioned too high, the user cannot see or it is physically inconvenient to see the information displayed on the display module.

Therefore, it is desirable to provide a display module, which can overcome the limitations described.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
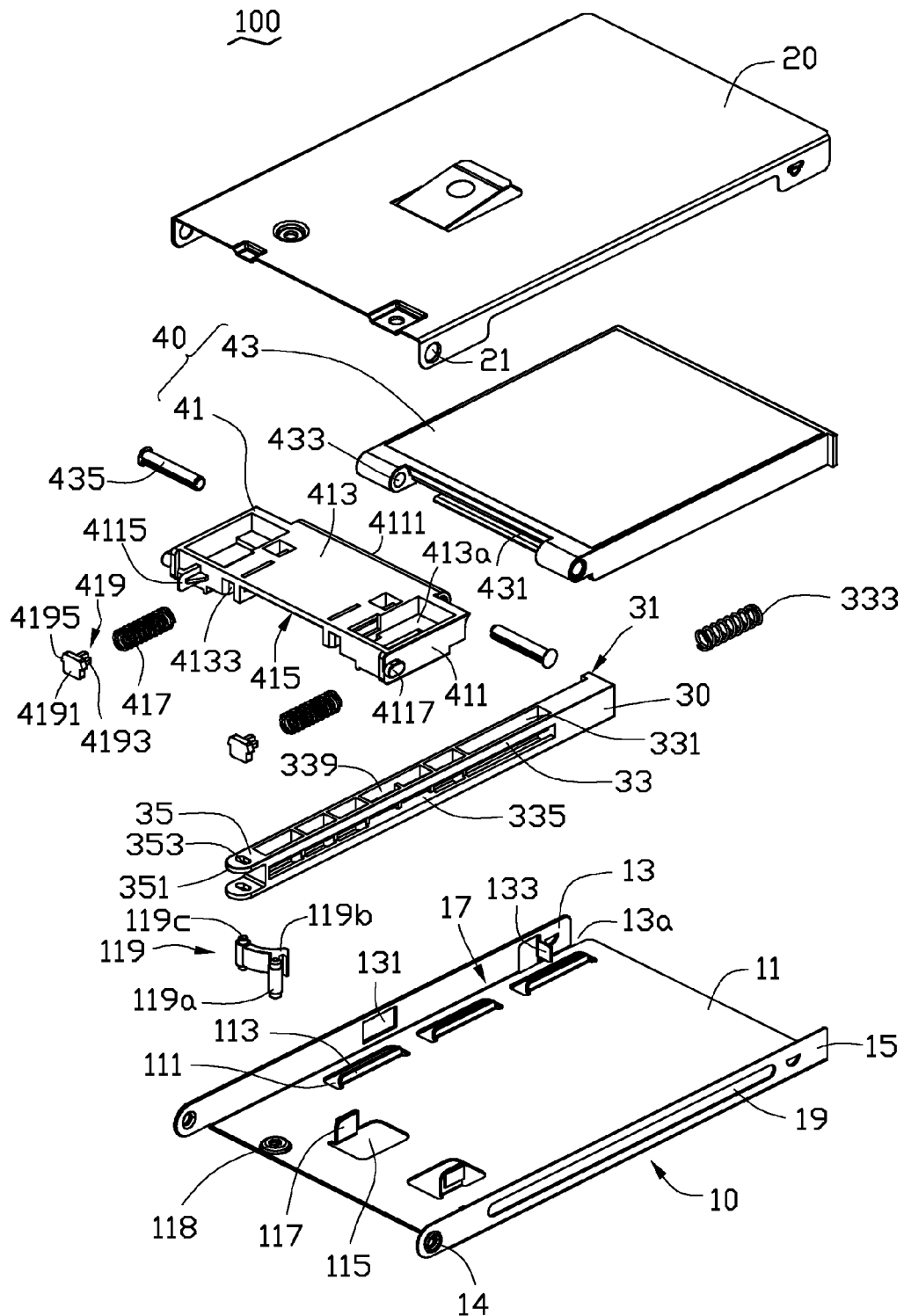
FIG. 1 is an exploded view of a display module according to an embodiment of the present disclosure.
Figure 2:
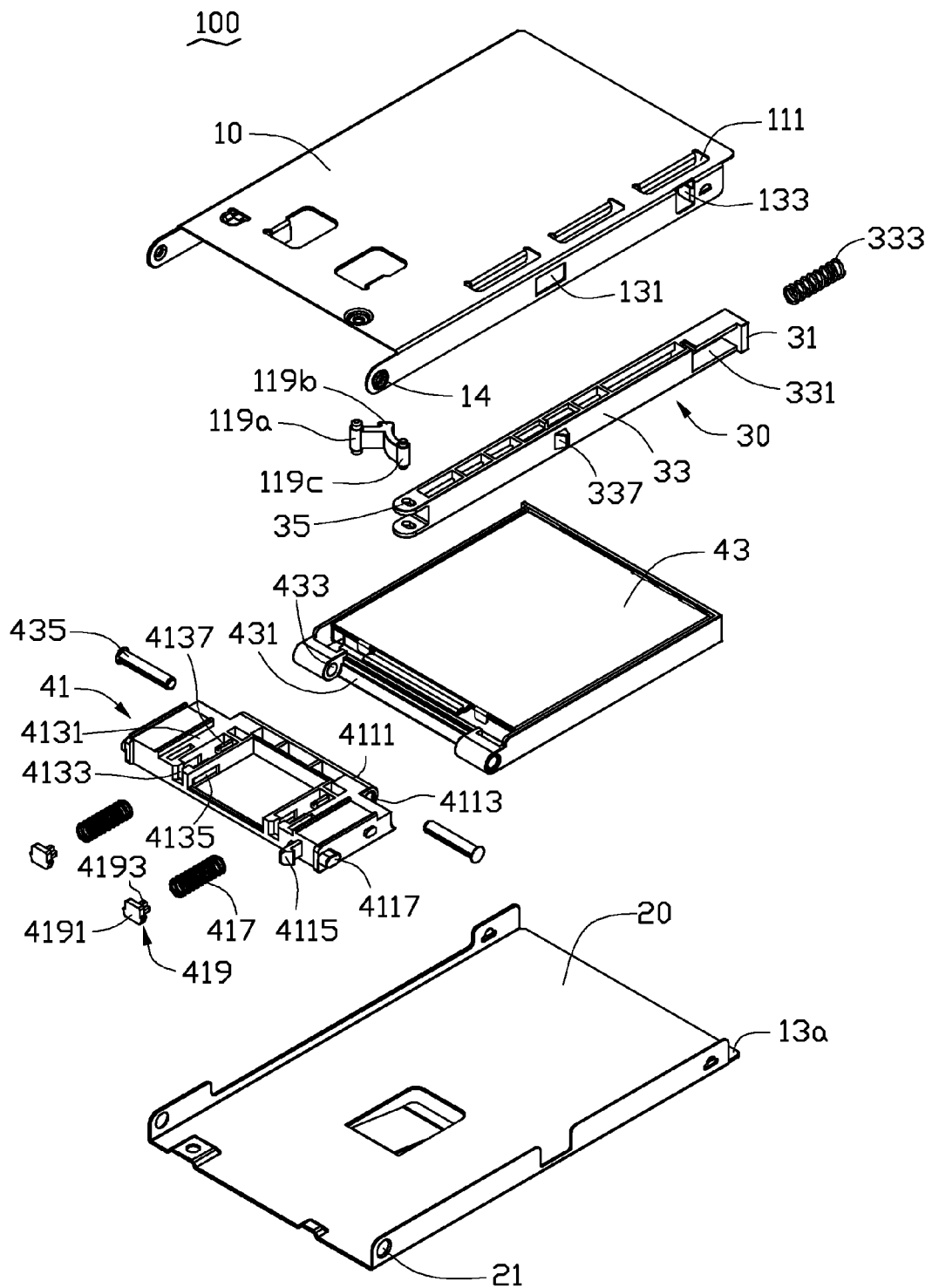
FIG. 2 is similar to FIG. 1, but viewed from another angle.
Figure 3:
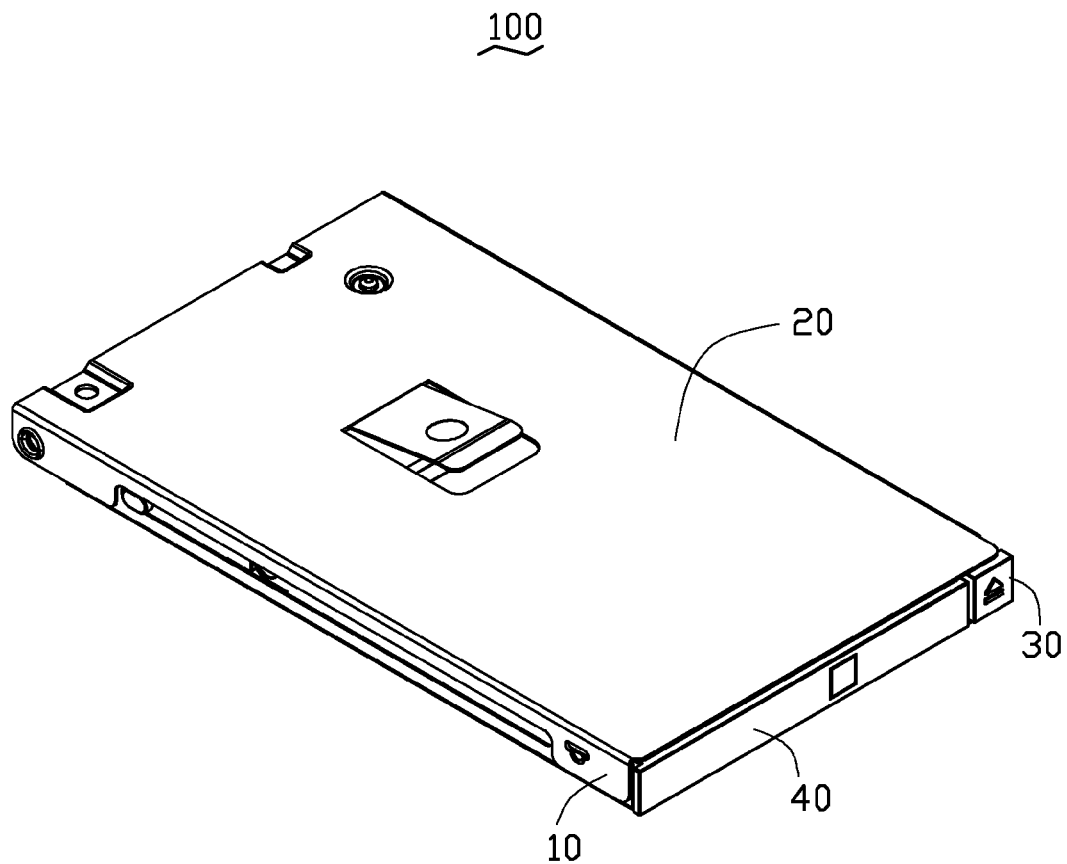
FIG. 3 is an isometric view of the display module of FIG. 1.
Figure 4:
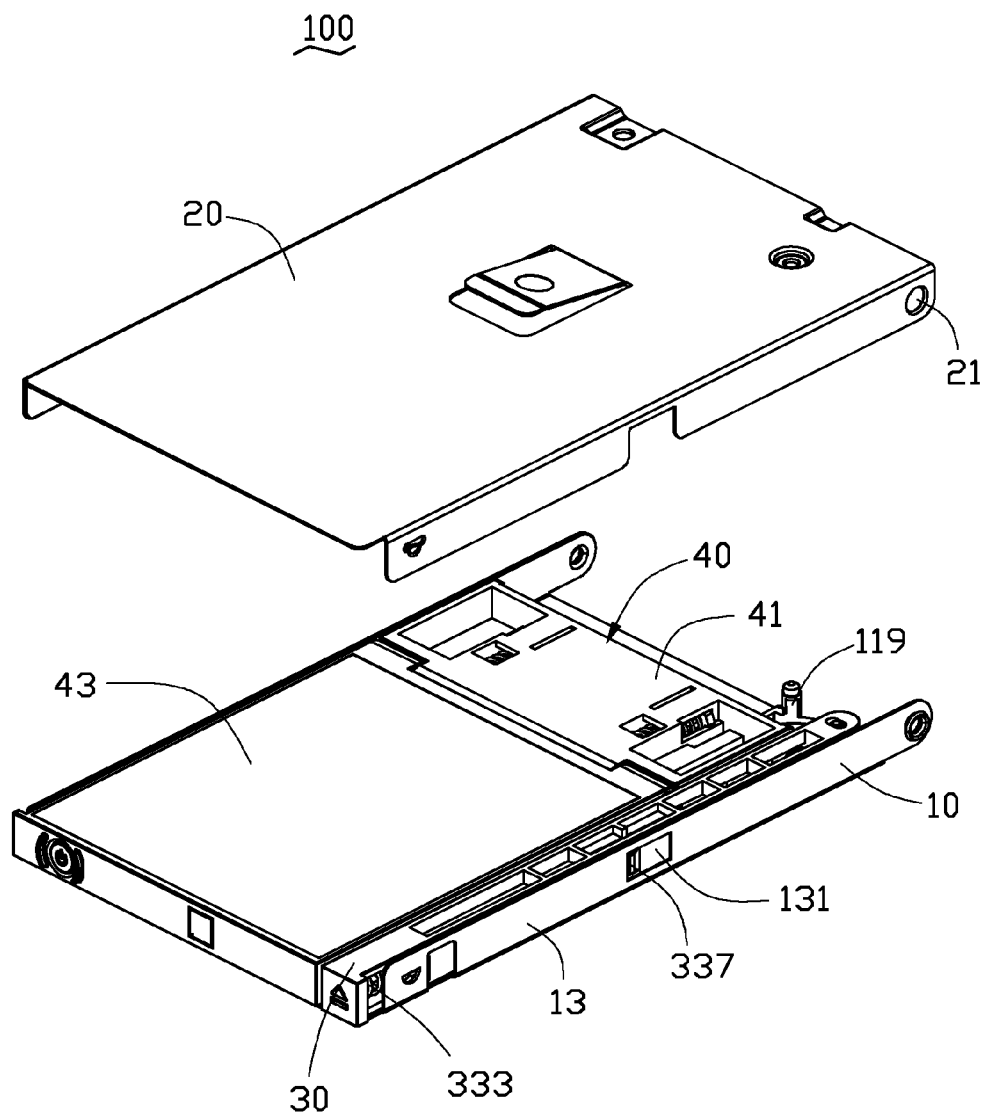
FIG. 4 is a partially exploded view of the display module of FIG. 3.
Figure 5:
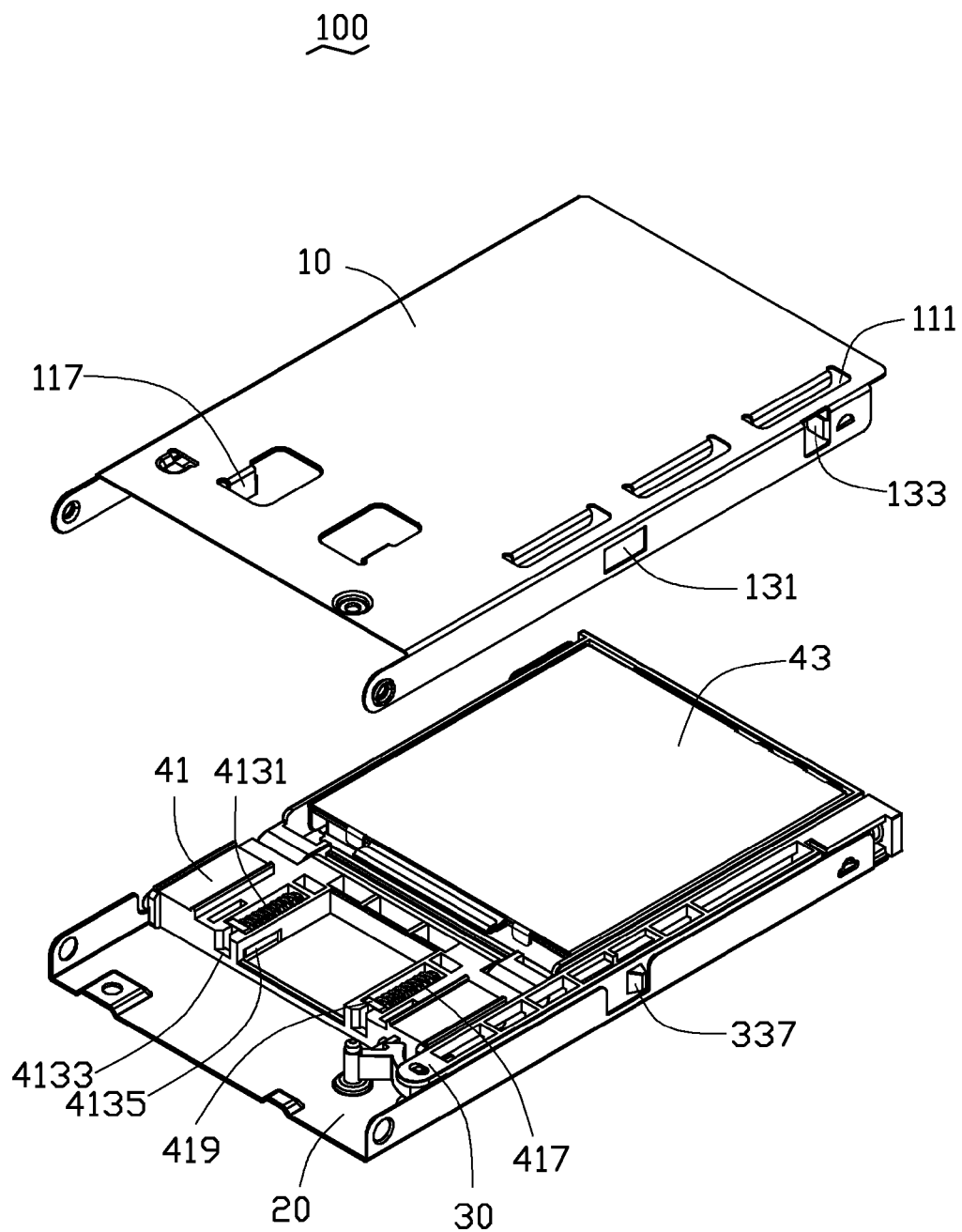
FIG. 5 is a partially exploded view of the display module of FIG. 3, but viewed from another angle.
Figure 6:
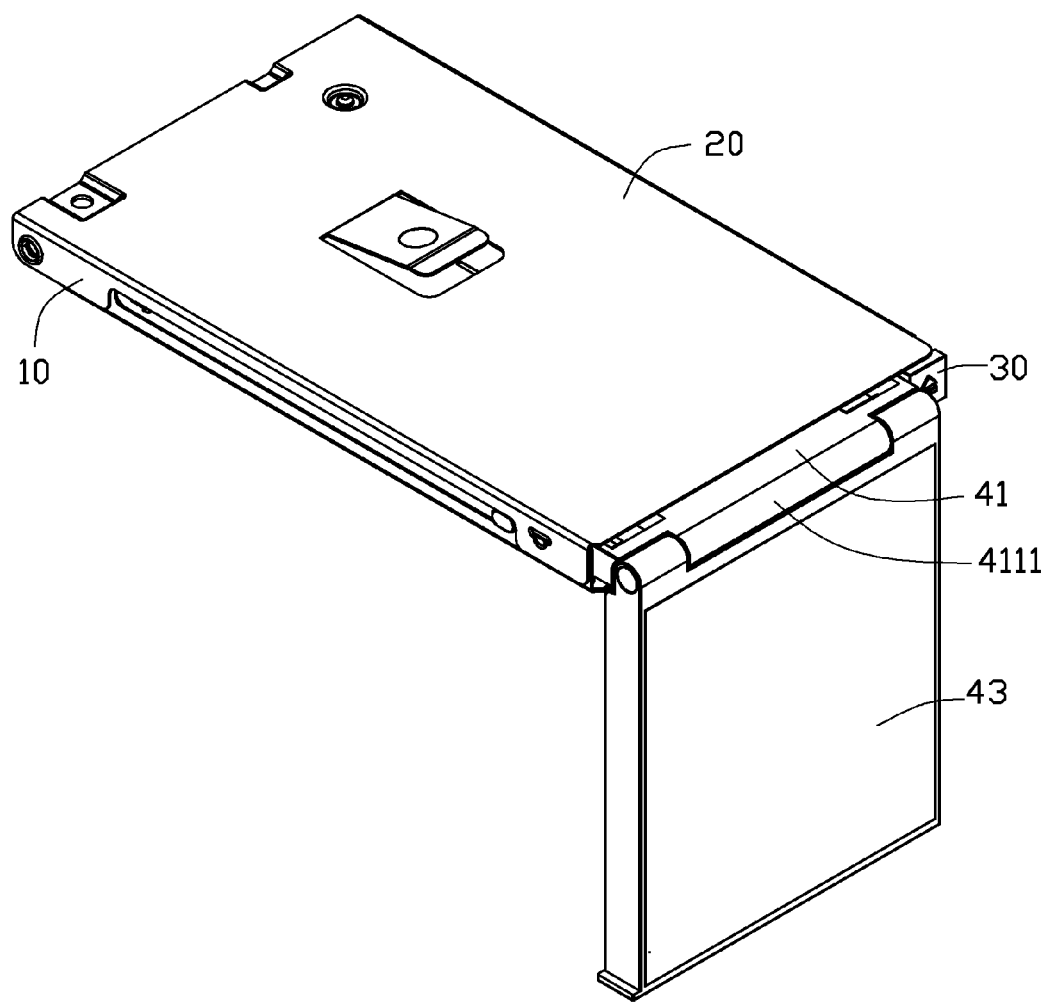
FIG. 6 is an isometric view, showing the display module of FIG. 3 in a working state.
Figure 7:
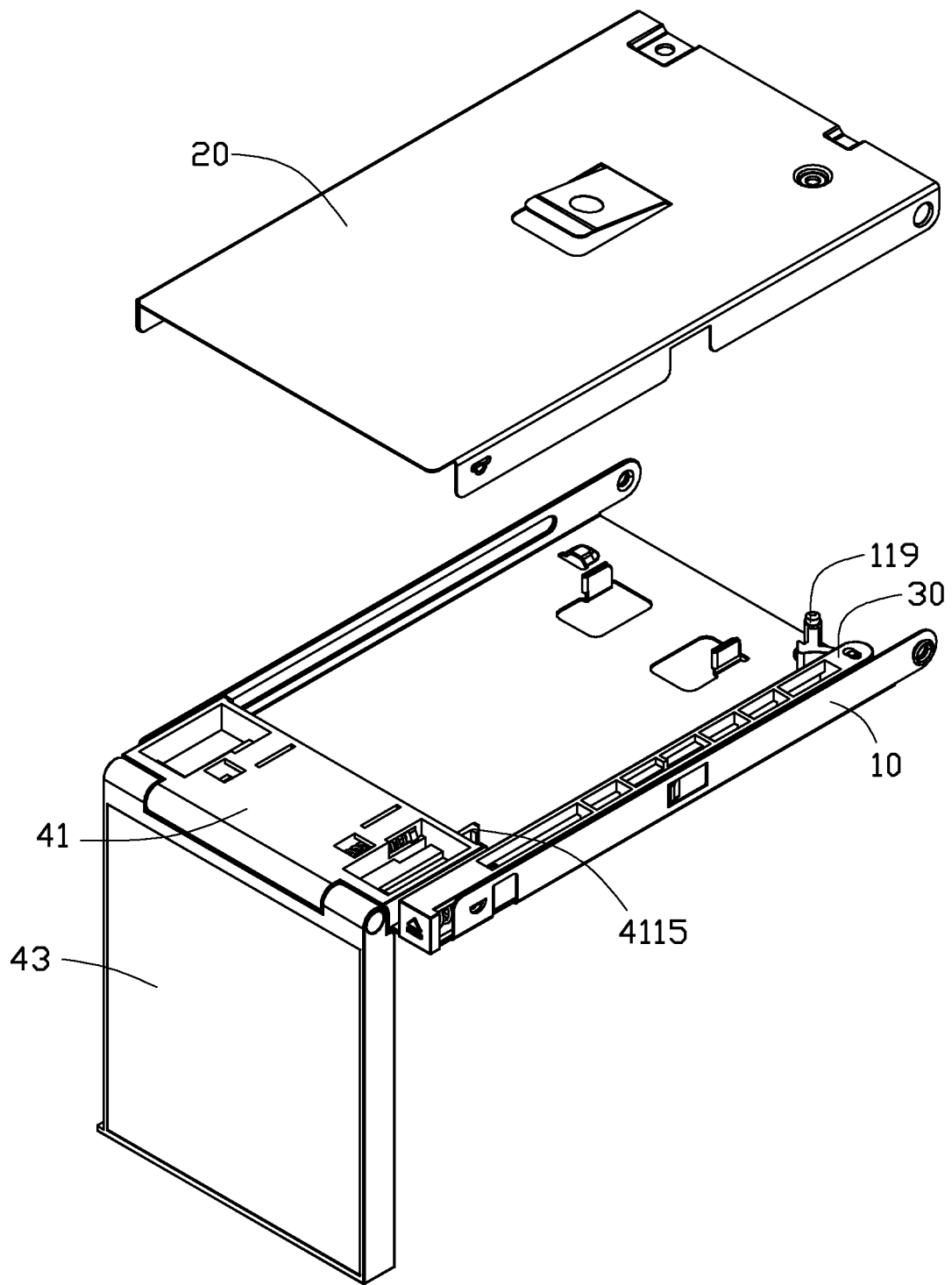
FIG. 7 is an exploded view of the display module of FIG. 6.

Referring to FIGS. 1 to 3, a display module 100, according to an exemplary embodiment, is shown. The display module 100 may be mounted on a server (not shown) or on other objects. The display module 100 includes a bottom cover 10, a top cover 20 engaged with the bottom cover 10, a pressing part 30 and a display panel 40, all arranged on the bottom cover 10.

The bottom cover 10 includes a rectangular bottom wall 11, and a first sidewall 13 and a second sidewall 15 perpendicularly extending from two opposite sides of the bottom wall 11. The bottom wall 11 defines a number of spaced cutouts 111 adjacent to the first sidewall 13. The spaced cutouts 111 are in a line. A shielding piece 113 extends perpendicularly from the inner edge of each cutout 111, away from the first sidewall 13. The bottom wall 11, the first sidewall 13, and the shielding pieces 113 cooperatively form a first groove 17 for receiving the pressing part 30. The bottom wall 11 further defines two first through holes 115. A protruding piece 117 extends perpendicularly from an edge of each first through hole 115. The two protruding pieces 117 are respectively adjacent to the first sidewall 13 and the second sidewall 15, and the height of the protruding pieces 117 is lower than the height of the first sidewall 13 and the second sidewall 15. The bottom wall 11 further defines a positioning hole 118 between the first sidewall 13 and one of the first through holes 115.

A locking part 119 is rotatably mounted on the bottom wall 11. The locking part 119 is Y-shaped, and includes a positioning end 119a, a first hook 119b, and a clamping end 119c. The included angle between the first hook 119b and the clamping end 119c is about 60 degrees. The positioning end 119a is partially received in the positioning hole 118. The locking part 119 is able to rotate in a limited manner about the positioning hole 118.

The first sidewall 13 defines a rectangular limiting hole 131 at a middle portion thereof. A stopping piece 133 extends from the first sidewall 13 towards the second sidewall 15 adjacent to one end of the first sidewall 13. The end of the first sidewall 13 terminates before the corresponding end of the bottom wall 11, thus forming an accommodation 13a for access.

The second sidewall 15 defines a second through groove 19. Stub circular projections 14 are respectively arranged on the first sidewall 13 and the second sidewall 15.

The top cover 20 is similar to the bottom cover 10 in shape and scale. The top cover 20 defines two reinforced second through holes 21 for pivoting around the stub circular projections 14. The top cover 20 is able to rotate about the stub circular projections 14 to open from or close with the bottom cover 10.

The pressing part 30 is a long and narrow square box in shape, and includes a pressing end 31, a main body 33, and a driving end 35.

The pressing end 31 projects from a side surface of the main body 33 adjacent to the first sidewall 13. When the pressing part 30 is received in the first groove 17, the pressing end 31 is received and is accessible in the accommodation 13a.

The main body 33 defines a first receiving groove 331 adjacent to the pressing end 31. A first elastic piece 333 is received in the first receiving groove 331. One end of the first elastic piece 333 presses against the inner wall of the first receiving groove 331, and the other end of the first elastic piece 333 presses against the stopping piece 133. A third groove 335 is defined on a side surface of the main body 33 away from the first sidewall 13. The third groove 335 is parallel to the second groove 19. A wedge 337 projects from the side surface of the main body 33 adjacent to the first sidewall 13 and is received in the limiting hole 131. When the pressing part 30 slides in the first groove 17, the wedge 337 slides in the limiting hole 131. The main body 33 further defines a number of first pierced holes 339 to make the pressing part 30 light and rigid.

The driving end 35 includes two opposite connecting pieces 351 extending from the main body 33. Each connecting piece 351 defines a connecting hole 353. The clamping end 119c is received between the two connecting pieces 351. Two rods (not labeled) extend from the clamping end 119c and are inserted into the two connecting holes 353 respectively, to allow the pressing part 30 to act upon the locking part 119.

Referring simultaneously to FIGS. 4 to 7, the display panel 40 includes a sliding part 41 and a display part 43 movably connected to the sliding part 41. The sliding part 41 defines four side surfaces 411, and a top surface 413 and an opposite bottom surface 415. The four side surfaces 411 respectively connect the top surface 413 to the bottom surface 415.

A connecting projection 4111 is formed on one side surface 411. The connecting projection 4111 defines a through pivot hole 4113. A second hook 4115 is formed on another side surface 411 of the sliding part 41 opposite to the connecting projection 4111. The second hook 4115 is used for engaging with the first hook 119b. Two pegs 4117 are formed on the other two side surfaces 411 respectively. The pegs 4117 are respectively received in the second groove 19 and the third groove 335.

The top surface 413 defines a number of second pierced holes 413a to reduce the weight of the sliding part 41. The bottom surface 415 defines two second receiving grooves 4131 corresponding to the two protruding pieces 117. Each second receiving groove 4131 includes an opening 4133 defined on one of the side surfaces 411 where the second hook 4115 is formed. Fourth grooves 4135 are defined on two opposite inner walls of each second receiving groove 4131. A rod 4137 projects from an inner wall of each second receiving groove 4131 opposite to the opening 4133. A stopping piece 419 is received in each second receiving groove 4131. Each stopping piece 419 includes a block 4191 and a rod 4193 perpendicularly extending from the block 4191. Two triangular projections 4195 are formed on two opposite sides of the block 4191. The triangular projections 4195 are slidably received in the fourth groove 4135. A second elastic piece 417 is received in each of the second receiving grooves 4131. The two ends of each second elastic piece 417 sleeve over the rods 4137 and 4193. The protruding pieces 117 are inserted into the second receiving grooves 4131 through the openings 4133, and rest against on the stopping pieces 419.

The display part 43 defines an indentation 431 for receiving the connecting projection 4111. The display part 43 further defines two through pivot holes 433 respectively adjacent to the two opposite ends of the indentation 431. Two pivot shafts 435 extend through the pivot holes 433, 4113 respectively to rotatably connect the display part 43 to the sliding part 41.

In assembly, the pressing part 30 is received in the first groove 17. The display panel 40 is put on the bottom cover 10. The pegs 4117 are respectively inserted into the second groove 19 and the third groove 335. The protruding pieces 117 are inserted into the second receiving grooves 4131 to abut the stopping pieces 419. The positioning end 119a is rotatably received in the positioning hole 118, the clamping end 119c of the locking part 119 is rotatably connected with the driving end 35 of the pressing part 30, and the first hook 119b is engaged with the second hook 4115. In this way, the locking part 119 locks the display panel 40 in place. At this time, the second elastic piece 417 is compressed, the first elastic piece 333 is uncompressed, and the wedge 337 resists on the inner wall of the limiting hole 131 adjacent to the pressing end 31. Finally, the stub circular projections 14 are inserted into the through holes 21 to connect the top cover 10 to the bottom cover 20, and the top cover 10 is closed to the bottom cover 20.

In use, the pressing end 31 is pressed towards the locking part 119, the first elastic piece 333 is compressed, and the wedge 337 slides a corresponding distance in the limiting hole 131. The driving end 35 drives the locking part 119 to rotate to make the first hook 119b disengage from the second hook 4115. In this way, the locking part 119 unlocks the display panel 40 to allow movement. The second elastic pieces 417 recover and push the display panel 40 out from the bottom cover 10. Then the pressing part 30 can be released, the first elastic piece 333 recovers to cause the locking part 119 to move back to the locking position. Finally, the display part 43 is fully pulled out from the bottom cover 10, and is rotated about the pivot shafts 435 to adjust the viewing angle of the display part 43 as the user requires.

After use, the display part 43 may be rotated to be level with the sliding part 41, then the display panel 40 is pushed back to the bottom cover 10 until the second hook 4115 is again engaged with the first hook 119. In this way, the locking part 119 relocks the display panel 40 to make the display panel 40 more secure between the top cover 20 and the bottom cover 10.

It will be understood that the above particular embodiments are shown and described by way of illustration only. The principles and the features of the present disclosure may be employed in various and numerous embodiments thereof without departing from the scope of the disclosure. The above-described embodiments illustrate the scope of the disclosure but do not restrict the scope of the disclosure.

What is claimed is:

1. A display module, comprising:
a bottom cover comprising a bottom wall, a first sidewall and a second sidewall, the first and second sidewalls extending from two opposite sides of the bottom wall, the bottom cover defining a first groove on the bottom wall, a limiting hole in the first sidewall, and a second groove on the second sidewall;
a locking part rotatably mounted on the bottom wall, and comprising a first hook;
a pressing part slidably received in the first groove, one end of the pressing part rotatably connected with the locking part, the pressing part comprising a wedge slidably received in the limiting hole; and
a display panel comprising a sliding part and a display part rotatably connected with the sliding part, the sliding part comprising one peg slidably received in the second groove and a second hook engaging with the first hook; wherein
when the pressing part is slid in the first groove to rotate the locking part, the first hook disengages with the second hook correspondingly, the display part is able to be pulled out from the bottom cover and then rotated to adjust a view angle.

2. The display module of claim 1, further comprising a top cover rotatably connected with and covered on the bottom cover.

3. The display module of claim 2, wherein one of the top cover and the bottom cover comprises stub circular projections, the other of the top cover and the bottom cover defines through holes spatially corresponding to the stub circular projections, each stub circular projection is received in a respective through hole to connect the top cover to the bottom cover.

4. The display module of claim 1, wherein the bottom cover further comprises a number of spaced shielding pieces extending perpendicularly from the bottom wall, the bottom wall, the first sidewall, and the shielding pieces cooperatively define the first groove.

5. The display module of claim 4, wherein the pressing part defines a first receiving groove, the bottom cover comprises a stopping piece inserted into the first receiving groove, the display module further comprises a first elastic piece received in the first receiving groove and resists on the stopping piece.

6. The display module of claim 1, wherein the locking part further comprises a positioning end and a clamping end, the bottom wall defines a positioning hole, the positioning end is rotatably inserted into the positioning hole, and the clamping end is rotatably connected with the pressing part.

7. The display module of claim 1, wherein the sliding part defines a second receiving groove, the second receiving groove has an open end, the sliding part further comprises a stopping piece slidably received in the second receiving groove and a second elastic piece received in the second receiving groove and positioned on the stopping piece, and the bottom cover further comprises a protruding piece extending from the bottom wall and inserted into the second receiving groove from the open end to resist on the stopping piece.

8. The display module of claim 7, wherein the sliding part defines two opposite third grooves in inner walls of the second receiving groove, the stopping piece comprises two projections on two sides thereof, and the two projections are respectively slidably received in the two third grooves.

9. The display module of claim 1, wherein the pressing part defines a fourth groove parallel with and facing the second groove, the sliding part further comprises another peg slidably received in the fourth groove.

10. The display module of claim 1, wherein the pressing part comprises a pressing end, the pressing end projects from a side surface of the pressing part and is opposite to the end of the pressing part rotatably connected with the locking part, an end of the first sidewall terminates before the corresponding end of the bottom wall, thus forming an accommodation receiving the pressing end.

\* \* \* \* \*